US012550497B2

(12) United States Patent
Kim et al.

(10) Patent No.: US 12,550,497 B2
(45) Date of Patent: Feb. 10, 2026

(54) COLOR CONVERSION SUBSTRATE AND DISPLAY DEVICE INCLUDING THE SAME

(71) Applicant: Samsung Display Co., LTD., Yongin-si (KR)

(72) Inventors: Youngmin Kim, Asan-si (KR); Sun-Kyu Joo, Suwon-si (KR); Haeil Park, Seoul (KR); Moonjung Baek, Seoul (KR); Keunchan Oh, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 525 days.

(21) Appl. No.: 17/987,636

(22) Filed: Nov. 15, 2022

(65) Prior Publication Data

US 2023/0163255 A1   May 25, 2023

(30) Foreign Application Priority Data

Nov. 24, 2021  (KR) .................. 10-2021-0163338
Feb. 25, 2022  (KR) .................. 10-2022-0024735

(51) Int. Cl.
*H10H 20/851* (2025.01)
*H10H 20/854* (2025.01)
(Continued)

(52) U.S. Cl.
CPC ......... *H10H 20/8513* (2025.01); *H10K 59/38* (2023.02); *H10H 20/854* (2025.01);
(Continued)

(58) Field of Classification Search
None
See application file for complete search history.

(56) References Cited

U.S. PATENT DOCUMENTS

| 9,288,897 B2 | 3/2016 | Chen et al. |
| 10,670,934 B2 | 6/2020 | Park et al. |

(Continued)

FOREIGN PATENT DOCUMENTS

| CN | 118946206 A | * | 11/2024 | ............ G09F 9/335 |
| CN | 120035292 A | * | 5/2025 | ............ H10H 20/01 |

(Continued)

*Primary Examiner* — Michael Lebentritt
(74) *Attorney, Agent, or Firm* — Womble Bond Dickinson (US) LLP

(57) ABSTRACT

A color conversion substrate comprising: a base substrate including a display area, a peripheral area positioned around the display area, and a sealing area positioned around the peripheral area; a color filter layer in the display area under the base substrate; a color conversion layer including a plurality of color conversion parts spaced apart from each other on a bottom surface of the color filter layer; a light blocking member in the peripheral area and the sealing area under the base substrate and including light blocking layers, wherein the light blocking layers overlap each other in a first direction that is a thickness direction of the base substrate and extend in a second direction perpendicular to the first direction; and a column spacer on a bottom surface of the light blocking member and extending in the second direction to be in the peripheral area and the sealing area.

22 Claims, 14 Drawing Sheets

(51) Int. Cl.
  *H10H 20/855* (2025.01)
  *H10K 50/844* (2023.01)
  *H10K 59/38* (2023.01)
  *H10K 59/80* (2023.01)
(52) U.S. Cl.
  CPC ......... *H10H 20/855* (2025.01); *H10K 50/844* (2023.02); *H10K 59/877* (2023.02); *H10K 59/879* (2023.02)

(56) References Cited

U.S. PATENT DOCUMENTS

| | | | |
|---|---|---|---|
| 2010/0079710 A1* | 4/2010 | Yang | G02F 1/136204 |
| | | | 349/110 |
| 2011/0090445 A1* | 4/2011 | Kim | G02F 1/1339 |
| | | | 349/139 |
| 2015/0198842 A1* | 7/2015 | Kwak | H10D 86/60 |
| | | | 257/43 |
| 2015/0370116 A1 | 12/2015 | Chae et al. | |
| 2017/0053949 A1* | 2/2017 | Shin | G02F 1/133345 |
| 2017/0090226 A1 | 3/2017 | Oh et al. | |
| 2017/0160583 A1 | 6/2017 | Baek et al. | |
| 2019/0331953 A1* | 10/2019 | Park | G02F 1/13394 |
| 2020/0161579 A1 | 5/2020 | Kim et al. | |
| 2021/0273022 A1 | 9/2021 | Park et al. | |
| 2021/0320150 A1 | 10/2021 | Yang et al. | |
| 2023/0189610 A1* | 6/2023 | Youn | H10K 59/38 |
| | | | 257/40 |

FOREIGN PATENT DOCUMENTS

| | | | | |
|---|---|---|---|---|
| KR | 20070082770 A | * | 8/2007 | ........... G02F 1/1339 |
| KR | 20080015561 A | * | 2/2008 | ........... G02F 1/1339 |
| KR | 101229288 B1 | * | 2/2013 | ........... G02F 1/1335 |
| KR | 10-1552902 B1 | | 9/2015 | |
| KR | 10-2017-0038963 A | | 4/2017 | |
| KR | 10-2017-0066725 A | | 6/2017 | |
| KR | 10-1800285 B1 | | 12/2017 | |
| KR | 10-2020-0058665 A | | 5/2020 | |
| KR | 10-2021-0110451 A | | 9/2021 | |
| KR | 10-2021-0127279 A | | 10/2021 | |
| KR | 20240169199 A | * | 12/2024 | ........... H10K 59/879 |
| WO | WO-2012069450 A1 | * | 5/2012 | ........ H01L 25/0753 |

* cited by examiner

COLOR CONVERSION SUBSTRATE AND DISPLAY DEVICE INCLUDING THE SAME

CROSS-REFERENCE TO RELATED APPLICATION

The present application claims priority to and the benefit of Korean Patent Application No. 10-2021-0163338, filed on Nov. 24, 2021, Korean Patent Application No. 10-2022-0024735, filed on Feb. 25, 2022, the entire content of each of which is incorporated herein by reference.

BACKGROUND

1. Field

Aspects of some embodiments of the present invention relate to a color conversion substrate and a display device including the color conversion substrate.

2. Description of the Related Art

Flat panel devices are replacing cathode ray tube display devices as display devices due to their relatively lightweight and thin characteristics. Flat panel display devices include, for example, liquid crystal display devices and organic light emitting diode display devices.

A display device including a display substrate including pixels and a color conversion substrate including a color filter and a color conversion part may be utilized to improve display quality. The color conversion part may convert a wavelength of a light provided from the display substrate. Accordingly, the display device including the color conversion part may emit a light having a color different from that of an incident light. For example, the color conversion part may include a wavelength conversion particle such as a quantum dot.

The above information disclosed in this Background section is only for enhancement of understanding of the background and therefore the information discussed in this Background section does not necessarily constitute prior art.

SUMMARY

Aspects of some embodiments include a color conversion substrate capable of preventing or reducing an abnormal phenomenon occurring in an edge area of the display device.

Aspects of some embodiments also include a display device including the color conversion substrate.

A color conversion substrate according to some embodiments may include a base substrate including a display area, a peripheral area positioned around the display area, and a sealing area positioned around the peripheral area, a color filter layer in the display area under the base substrate, a color conversion layer including a plurality of color conversion parts spaced apart from each other on a bottom surface of the color filter layer, a light blocking member in the peripheral area and the sealing area under the base substrate and including light blocking layers, wherein the light blocking layers may overlap each other in a first direction that is a thickness direction of the base substrate and extend in a second direction perpendicular to the first direction, and a column spacer on a bottom surface of the light blocking member and extending in the second direction to be in the peripheral area and the sealing area.

According to some embodiments, a portion of the column spacer may overlap a sealing member in the sealing area.

According to some embodiments, a side surface of the column spacer may be exposed at an outermost edge of the sealing area.

According to some embodiments, the column spacer may comprise a polymer resin and a pigment or a dye may be dispersed in the polymer resin.

According to some embodiments, the color conversion substrate may further include a low refractive index layer surrounding the color filter layer and the light blocking member, and the column spacer may be on a bottom surface of the low refractive index layer.

According to some embodiments, the color conversion substrate may further include a first capping layer on the bottom surface of the low refractive index layer, and a second capping layer on a bottom surface of the first capping layer in the peripheral area and the sealing area and on a bottom surface of the color conversion layer in the display area. The column spacer may be on a bottom surface of the second capping layer.

According to some embodiments, the color conversion substrate may further include a low refractive index layer surrounding the color conversion layer and the light blocking member, and the column spacer may be on a bottom surface of the low refractive index layer.

According to some embodiments, the color conversion substrate may further include a first capping layer on the bottom surface of the low refractive index layer, and the column spacer may be on a bottom surface of the first capping layer.

According to some embodiments, the light blocking member may include a first light blocking layer, a second light blocking layer, and a third light blocking layer overlapping each other in the first direction.

According to some embodiments, the color filter layer may include a red color filter, a green color filter, and a blue color filter. The color conversion layer may include a first color conversion part corresponding to the red color filter, a second color conversion part corresponding to the green color filter, and a third color conversion part corresponding to the blue color filter.

According to some embodiments, the first color conversion part may include a first wavelength conversion particle that convert an incident light into a light having a red color, the second color conversion part may include a second wavelength conversion particle that convert an incident light into a light having a green color, and the third conversion part may include a third wavelength conversion particle that convert an incident a light into a blue color.

According to some embodiments, the first color conversion part, the second color conversion part, and the third color conversion part may further include a scattering particle configured to scatter an incident light.

According to some embodiments, the color filter layer may include a red color filter, a green color filter, and a blue color filter. The color conversion layer may include a first color conversion part corresponding to the red color filter, a second color conversion part corresponding to the green color filter, and a light transmitting part corresponding to the blue color filter.

According to some embodiments, the light transmitting part may include a scattering particle configured to scatter an incident light.

A color conversion substrate according to some embodiments may include a base substrate including a display area, a peripheral area positioned around the display area, and a sealing area positioned around the peripheral area, a color filter layer in the display area under the base substrate, a color conversion layer including a plurality of color conversion parts spaced apart from each other on a bottom surface of the color filter layer, a light blocking member in the peripheral area and the sealing area under the base substrate and including light blocking layers, wherein the light blocking layers may overlap each other in a first direction that is a thickness direction of the base substrate and extend in a second direction perpendicular to the first direction, and a column spacer on a bottom surface of the light blocking member and extending in the second direction so as not to be in the sealing area but to be in the peripheral area.

A display device according to some embodiments may include a display substrate including a first base substrate and pixels on the first base substrate, a color conversion substrate facing the display substrate, and a sealing member bonding the display substrate and the color conversion substrate. The color conversion substrate may include a base substrate including a display area, a peripheral area positioned around the display area, and a sealing area positioned around the peripheral area, a color filter layer in the display area under the base substrate, a color conversion layer including a plurality of color conversion parts spaced apart from each other on a bottom surface of the color filter layer, a light blocking member in the peripheral area and the sealing area under the base substrate and including light blocking layers, wherein the light blocking layers may overlap each other in a first direction that is a thickness direction of the base substrate and extend in a second direction perpendicular to the first direction, and a column spacer on a bottom surface of the light blocking member and extending in the second direction to be in the peripheral area and the sealing area.

According to some embodiments, the display device may further include an encapsulation layer covering the pixels and including at least one inorganic encapsulation layer and at least one organic encapsulation layer.

According to some embodiments, the display device may further include a filling layer between the display substrate and the color conversion substrate.

According to some embodiments, a first distance between the first base substrate and the second base substrate in the sealing area may be greater than a second distance between the first base substrate and the second base substrate in the display area.

According to some embodiments, all of the pixels may be configured to generate blue light.

According to some embodiments, a portion of the column spacer may overlap a sealing member in the sealing area.

According to some embodiments, a side of the column spacer may be exposed at an outermost edge of the sealing area.

The display device according to some embodiments may include the display substrate and the color conversion substrate. The color conversion substrate may include the light blocking member in the peripheral area and the sealing area to surround the display area, and the column spacer on a bottom surface of the light blocking member. While the display substrate and the color conversion substrate are bonded, the column spacer may minimize deformation of the display substrate and the color conversion substrate due to external pressure. Accordingly, the abnormal phenomena occurring in the edge area of the display device may be prevented or reduced.

It is to be understood that both the foregoing general description and the following detailed description are merely example characteristics and explanatory and are intended to provide further explanation of embodiments according to the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
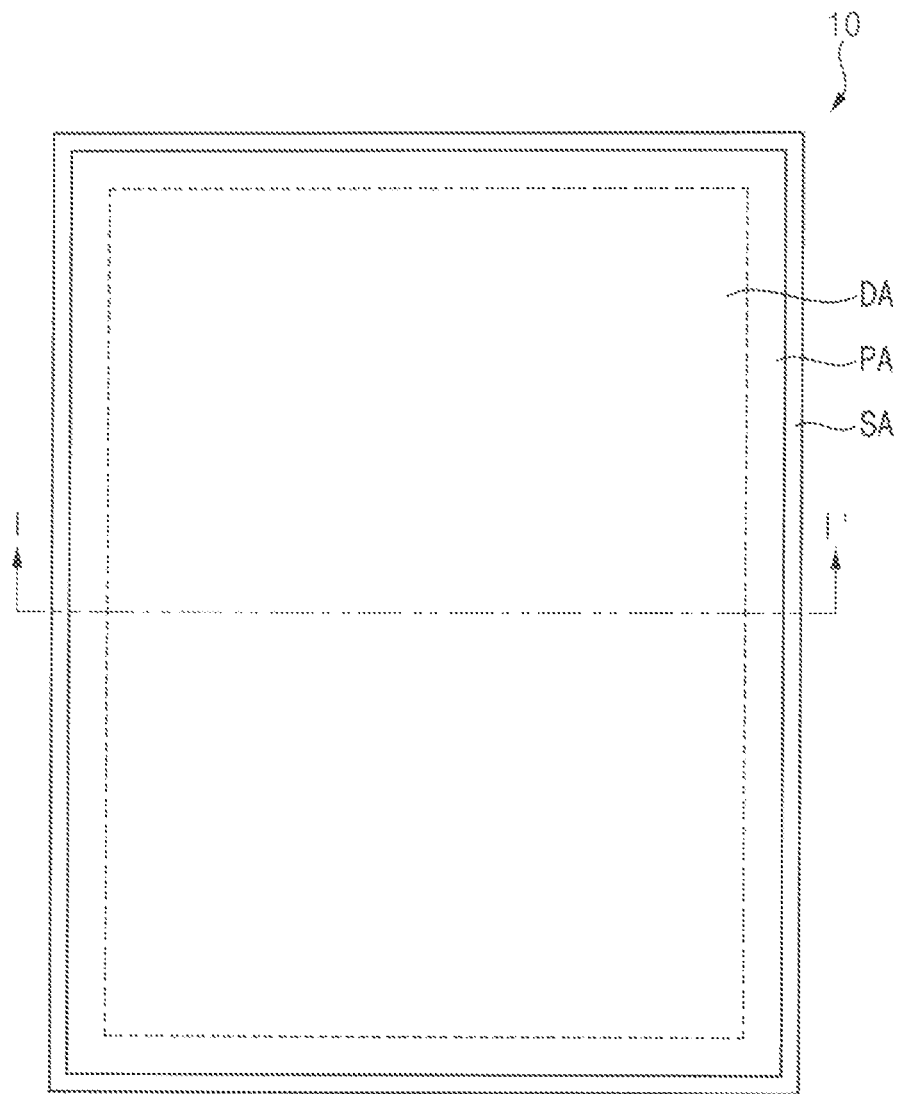
FIG. 1 is a plan view illustrating a display device according to some embodiments.

Aspects of some embodiments of the invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be more thorough and more complete, and will more fully convey the scope of embodiments according to the present invention to those skilled in the art. Like reference numerals refer to like elements throughout.

Figure 2:
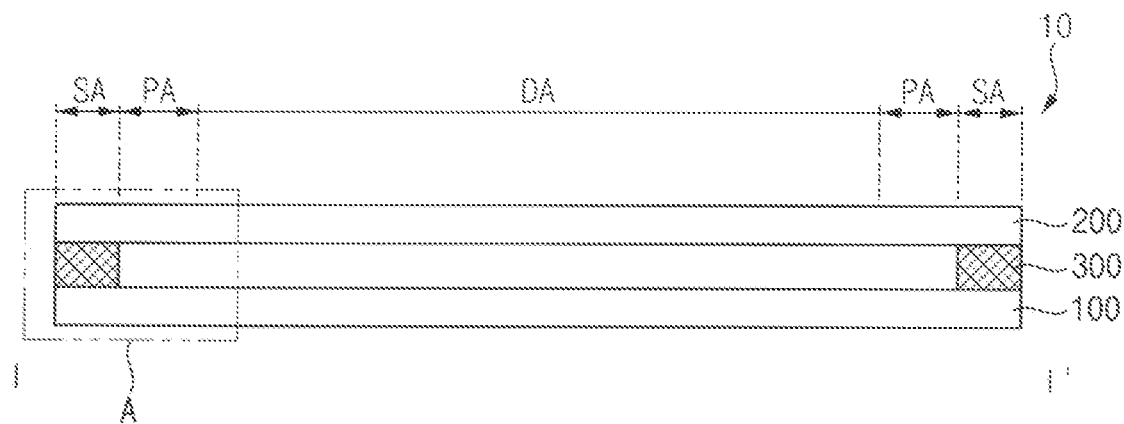
FIG. 2 is a cross-sectional view taken along the line I-I' of FIG. 1 according to some embodiments.

FIG. 1 is a plan view illustrating a display device according to some embodiments. FIG. 2 is a cross-sectional view taken along the line I-I' of FIG. 1.

Referring to FIGS. 1 and 2, a display device 10 may include a first substrate 100, a second substrate 200, and a sealing member 300. The second substrate 200 may face the first substrate 100, and may be positioned in a first direction D1 from the first substrate 100. For example, the first direction D1 is a front direction (e.g., a direction facing away from, or normal with respect to, a display surface of the display device 10) of the display device 10. The sealing member 300 may bond the first substrate 100 and the second substrate 200 to each other.

The display device 10 may include a display area DA on which an image is displayed, a peripheral area PA positioned around the display area DA, and a sealing area SA positioned around the peripheral area PA. For example, the peripheral area PA may surround the display area DA in a plan view, and the sealing area SA may surround the peripheral area PA in a plan view.

The first substrate 100 may include a plurality of pixels and may be referred to as a display substrate. The pixels may be located in the display area DA of the first substrate 100. Each of the pixels may include a driving element and a light emitting element. The driving element may include at least one thin film transistor. The light emitting element may generate light based on a driving signal. For example, the light emitting element may be an inorganic light emitting diode or an organic light emitting diode.

The second substrate 200 may include a color conversion part and may be referred to as a color conversion substrate. The color conversion part may be located in the display area DA and may convert a wavelength of a light generated from the light emitting element of the first substrate 100. The second substrate 200 may further include a color filter layer to transmit a light having a specific color.

The sealing member 300 may bond the first substrate 100 and the second substrate 200 to each other. The sealing member 300 may be located in the sealing area SA between the first substrate 100 and the second substrate 200. For example, the sealing member 300 may be located in the sealing area SA between the first substrate 100 and the second substrate 200 to surround the peripheral area PA in a plan view. Thus, the sealing member 300 may be located at the outer edges of the display device 10.

For example, the sealing member 300 may have a hollow rectangular shape (e.g., a rectangular frame shape) in a plan view. That is, the sealing member 300 may be located around the perimeter of (e.g., outside a footprint of) the peripheral area PA and the display area DA, while not being located in the peripheral area PA or the display area DA. However, embodiments are not limited thereto, and the sealing member 300 may have various planar shapes corresponding to a planar shape of the first substrate 100 and/or the second substrate 200. For example, when the first substrate 100 and/or the second substrate 200 has a planar shape such as a triangle, a rhombus, a polygon, a circle, an oval, or the like, the sealing member 300 may have a hollow triangle, a hollow rhombus, a hollow polygon, a hollow circle, a hollow oval, or the like in a plan view.

According to some embodiments, a filling layer may be located between the first substrate 100 and the second substrate 200. For example, the filling layer may function as a buffer against external pressure applied to the display device 10. For example, the filling layer may maintain a gap between the first substrate 100 and the second substrate 200, and may fill a space or gap between the first substrate 100 and the second substrate 200.

Figure 3:
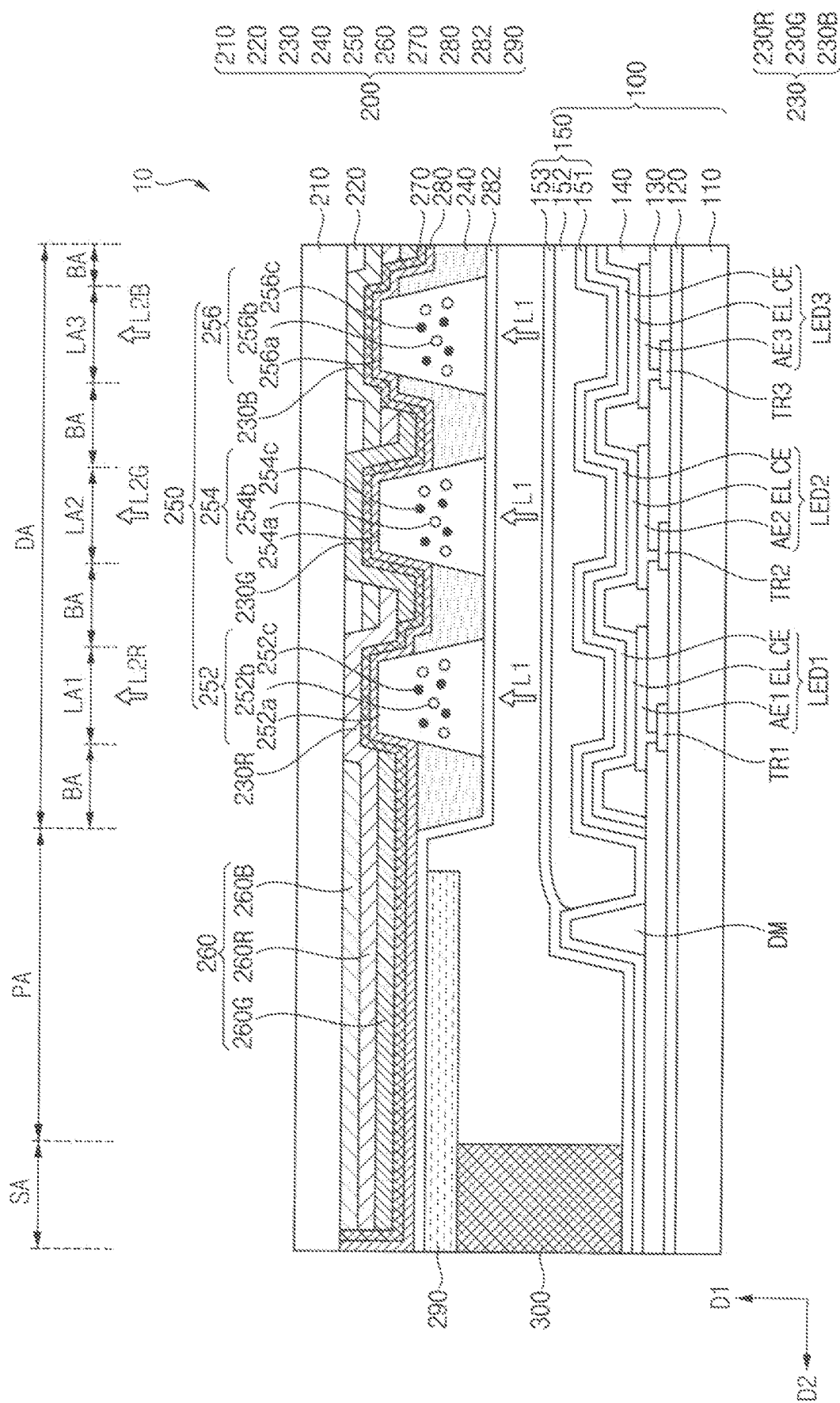
FIG. 3 is an enlarged cross-sectional view of an example of area 'A' of FIG. 2 according to some embodiments.

FIG. 3 is an enlarged cross-sectional view of an example of area 'A' of FIG. 2.

Referring to FIGS. 1 to 3, the display area DA may include a light emitting area and a light blocking area BA. A light generated by the first substrate 100 and incident into the second substrate 200 (hereinafter, an incident light L1) may be emitted to an outside through the light emitting area. The light emitting area may include first to third light emitting areas LA1, LA2, and LA3 for emitting light of different colors. For example, the first light emitting area LA1 may emit a first transmitted light L2R having a red color, the second light emitting area LA2 may emit a second transmitted light L2G having a green color, and the third light emitting area LA3 may emit a third transmitted light L2B having a blue color.

According to some embodiments, the first to third light emitting areas LA1, LA2, and LA3 may be spaced apart from each other in a plan view, and may be arranged in a repeated sequence. The light blocking area BA may be surround the first to third light emitting areas LA1, LA2, and LA3 in a plan view. For example, the light blocking area BA may have a grid shape in a plan view.

According to some embodiments, the first substrate 100 may include a first base substrate 110, a buffer layer 120, first to third driving elements TR1, TR2, and TR3, an insulating structure 130, a pixel defining layer 140, first to third light emitting elements LED1, LED2, and LED3, and an encapsulation layer 150.

The first base substrate 110 may be an insulating substrate formed of a transparent or opaque material. According to some embodiments, the first base substrate 110 may include glass. In this case, the first substrate 100 may be a rigid display substrate. According to some embodiments, the first base substrate 110 may include plastic. In this case, the first substrate 100 may be a flexible display substrate.

According to some embodiments, the first base substrate 110 may include a light blocking material. For example, at least a portion of the first base substrate 110 may include a light blocking material such as a black pigment, a dye, a carbon black, or the like. That is, the first base substrate 110 may be black.

The buffer layer 120 may be located on the first base substrate 110. The buffer layer 120 may prevent or reduce impurities such as oxygen or moisture from diffusing to an upper portion of the first base substrate 110 through the first base substrate 110. The buffer layer 120 may include an inorganic insulating material such as a silicon compound, a metal oxide, or the like. Examples of the inorganic insulating material may include silicon oxide ("SiO"), silicon nitride ("SiN"), silicon oxynitride ("SiON"), silicon oxycarbide ("SiOC"), silicon carbonitride ("SiCN"), aluminum oxide ("Ala"), aluminum nitride ("AlN"), tantalum oxide ("TaO"), hafnium oxide ("HfO"), zirconium oxide ("ZrO"), titanium oxide ("TiO"), or the like. These can be used alone or in a combination thereof. The buffer layer 120 may have a single-layered structure or a multi-layered structure including a plurality of insulating layers.

The first to third driving elements TR1, TR2, and TR3 may be located in the display area DA on the buffer layer 120. Each of the first to third driving elements TR1, TR2, and TR3 may include at least one thin film transistor. A channel layer of the thin film transistor may include an oxide semiconductor, a silicon semiconductor, an organic semiconductor, or the like. For example, the oxide semiconductor may include at least one oxide of indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"). The silicon semiconductor may include an amorphous silicon, a polycrystalline silicon, or the like.

The insulating structure 130 may cover the first to third driving elements TR1, TR2 and TR3. The insulating structure 130 may include a combination of an inorganic insulating layer and an organic insulating layer.

First to third pixel electrodes AE1, AE2, and AE3 may be located on the insulating structure 130. Each of the first to third pixel electrodes AE1, AE2, and AE3 may include a conductive material such as a metal, an alloy, a conductive metal nitride, a conductive metal oxide, a transparent conductive material, or the like. Each of the first to third pixel electrodes AE1, AE2, and AE3 may have a single-layered structure or a multi-layered structure including a plurality of conductive layers.

The first to third pixel electrodes AE1, AE2, and AE3 may be electrically connected to the first to third driving elements TR1, TR2, and TR3 through contact holes formed in the insulating structure 130, respectively.

The pixel defining layer 140 may be located on the first to third pixel electrodes AE1, AE2, and AE3. The pixel defining layer 140 may include an organic insulating material. Examples of the organic insulating material include a photoresist, a polyacryl-based resin, a polyimide-based resin, a polyamide-based resin, a siloxane-based resin, an acryl-based resin, an epoxy-based resin, or the like. These can be used alone or in a combination thereof. The pixel defining layer 140 may define pixel openings respectively exposing at least a portion of each of the first to third pixel electrodes AE1, AE2, and AE3.

An emission layer EL may be located on the first to third pixel electrodes AE1, AE2, and AE3 exposed by the pixel openings of the pixel defining layer 140. According to some embodiments, the emission layer EL may continuously extend over the plurality of pixels in the display area DA. According to some embodiments, the emission layer EL may be separated from an emission layer of an adjacent pixel.

The emission layer EL may include at least one of an organic light emitting material or a quantum dot. According to some embodiments, the emission layer EL may generate a blue light. However, embodiments according to the present disclosure are not limited thereto. For example, the emission layer EL may generate a red light, a green light, or the like. According to some embodiments, the emission layer EL may generate lights having different colors in different pixels.

According to some embodiments, functional layers such as a hole injection layer, a hole transport layer, an electron transport layer, and an electron injection layer may be located on an upper portion and/or a lower portion of the emission layer EL.

A common electrode CE may be located on the emission layer EL. The common electrode CE may include a conductive material such as a metal, an alloy, a conductive metal nitride, a conductive metal oxide, a transparent conductive material, or the like. The common electrode CE may have a single-layered structure or a multi-layered structure including a plurality of conductive layers. According to some embodiments, the common electrode CE may continuously extend over the plurality of pixels in the display area DA.

The first electrode AE1, the emission layer EL, and the common electrode CE may form the first light emitting element LED1. The second pixel electrode AE2, the emission layer EL, and the common electrode CE may form the second light emitting element LED2. The third pixel electrode AE3, the emission layer EL, and the common electrode CE may form the third light emitting element LED3.

The encapsulation layer 150 may be located on the common electrode CE. The encapsulation layer 150 may include at least one inorganic encapsulation layer and at least one organic encapsulation layer. According to some embodiments, the encapsulation layer 150 may include a first inorganic encapsulation layer 151 located on the common electrode CE, an organic encapsulation layer 152 located on the first inorganic encapsulation layer 151, and a second inorganic encapsulation layer 153 located on the organic encapsulation layer 152.

According to some embodiments, a dam DM may be located in the peripheral area PA on the first base substrate 110. For example, the dam DM may surround the display area DA in a plan view. The dam DM may prevent an organic material from overflowing to an outside of the dam DM (e.g., to a second direction D2 in FIG. 3) during a formation of the organic encapsulation layer 152.

The second substrate 200 may be located in the first direction D1 from the encapsulation layer 150. Hereinafter, the first direction D1 may be referred to as a front direction or a thickness direction.

According to some embodiments, the second substrate 200 may include a second base substrate 210, an organic layer 220, a color filter layer 230, a partition wall 240, a color conversion layer 250, and a light blocking member 260.

The second base substrate 210 may be an insulating substrate formed of a transparent material. The second base substrate 210 may include glass or plastic. The second base substrate 210 may include the display area DA, the peripheral area PA, and the sealing area SA.

The organic layer 220 may be located in the display area DA under the second base substrate 210. According to some embodiments, the organic layer 220 may overlap the light blocking area BA, and may not overlap the first to third light emitting areas LA1, LA2, and LA3. That is, the organic layer 220 may define the light blocking area BA and the first to third light emitting areas LA1, LA2, and LA3 in the display area DA. The organic layer 220 may be formed of a transparent or opaque organic material. According to some embodiments, the organic layer 220 may also overlap the first to third light emitting areas LA1, LA2, and LA3.

The color filter layer 230 may be located in the display area DA under the second base substrate 210. According to some embodiments, the color filter layer 230 may include a red color filter 230R, a green color filter 230G, and a blue color filter 230B.

The red color filter 230R may overlap the first light emitting area LA1, and may selectively transmit red light. The green color filter 230G may overlap the second light emitting area LA2, and may selectively transmit green light. The blue color filter 230B may overlap the third light emitting area LA3, and may selectively transmit blue light.

According to some embodiments, each of the red color filter 230R, the green color filter 230G, and the blue color filter 230B may further overlap the light blocking area BA. That is, as illustrated in FIG. 3, the red color filter 230R may overlap the first light emitting area LA1 and the light blocking area BA, and may not overlap the second and third light emitting areas LA2 and LA3. The green color filter 230G may overlap the second light emitting area LA2 and the light blocking area BA, and may not overlap the first and third light emitting areas LA1 and LA3. The blue color filter 230B may overlap the third light emitting area LA3 and the light blocking area BA, and may not overlap the first and second light emitting areas LA1 and LA2. In this case, in the light blocking area BA, a portion of the red color filter 230R, a portion of the green color filter 230G, and a portion of the blue color filter 230B may overlap each other in the first direction D1. Accordingly, color mixing between the adjacent first to third light emitting areas LA1, LA2, and LA3 may be prevented.

The partition wall 240 may be located in the display area DA under the color filter layer 230. A plurality of openings may be formed in the partition wall 240. For example, as illustrated in FIG. 3, the openings of the partition wall 240 may expose the first to third light emitting areas LA1, LA2, and LA3, respectively. The partition wall 240 may form a space to receive an ink composition for forming the color conversion layer 250. For example, the partition wall 240 may entirely overlap the light blocking area BA, and may have a grid shape in a plan view.

According to some embodiments, the partition wall 240 may include an organic material. According to some embodiments, the partition wall 240 may further include a light blocking material. For example, at least a portion of the partition wall 240 may include a light blocking material such as black pigment, a dye, a carbon black, or the like.

The color conversion layer 250 may include color conversion parts spaced apart from each other on a bottom surface of the color filter layer. According to some embodiments, the color conversion layer 250 may include a first color conversion part 252, a second color conversion part 254, and a third color conversion part 256. The first color conversion part 252, the second color conversion part 254, and the third color conversion part 256 may be located in the display area DA under the color filter layer 230, and may overlap the first to third light emitting areas LA1, LA2 and LA3, respectively. For example, the first color conversion part 252, the second color conversion part 254, and the third color conversion part 256 may be located in the openings of the partition wall 240, respectively.

The first color conversion part 252 may overlap the first light emitting area LA1. The first color conversion part 252 may convert the incident light L1 to the first transmitted light L2R having a red color. For example, the first color conversion part 252 may include a resin part 252a, scattering particle 252b, and wavelength conversion particle 252c.

The scattering particle 252b may scatter the incident light L1 without substantially changing the wavelength of the incident light. Therefore, a path of a light progressing in (e.g., progressing through) the first color conversion part 252 may be increased. The scattering particle 252b may include a metal oxide, an organic material, or the like. According to some embodiments, the scattering particle 252b may be omitted.

According to some embodiments, the wavelength conversion particle 252c may include a quantum dot. The quantum dot may be defined as a nano-crystalline semiconductor material. The quantum dot may absorb the incident light L1 and emit a light having a wavelength different from a wavelength of the incident light. For example, the quantum dot may have a diameter (e.g., an average particle size) equal to or less than about 100 nm. According to some embodiments, the quantum dot may have a diameter of about 1 nm to about 20 nm. For example, each of the wavelength conversion particle 252c may include a quantum dot that is to absorb the incident light L1 and emit red light.

The scattering particle 252b and the wavelength conversion particle 252c may be located in the resin part 252a. For example, the resin part 252a may include an epoxy-based resin, an acryl-based resin, a phenol-based resin, a melamine-based resin, a cardo-based resin, an imide-based resin, or the like.

The first color conversion part 252 may convert the incident light L1 to emit the first transmitted light L2R having a red color. A remainder of the incident light L1, which is not converted by the first color conversion part 252, may be blocked by the red color filter 230R. Accordingly, in the first light emitting area LA1, the first transmitted light L2R having a red color may be emitted to the outside (i.e., to the first direction D1) passing through the second base substrate 210.

The second color conversion part 254 may overlap the second light emitting area LA2. The second color conversion part 254 may convert the incident light L1 to the second transmitted light L2G having a green color. For example, the second color conversion part 254 may include a resin part 254a, scattering particle 254b, and wavelength conversion particle 254c. The resin part 254a and the scattering particle 254b of the second color conversion part 254 may be substantially the same as or similar to the resin part 252a and the scattering particle 252b of the first color conversion part 252.

For example, the wavelength conversion particle 254c of the second color conversion part 254 may include a quantum dot that is to absorb the incident light L1 and emit green light. Accordingly, the second color conversion part 254 may convert the incident light L1 to emit the second transmitted light L2R having a green color. A remainder of the incident light L1, which is not converted by the second color conversion part 254, may be blocked by the green color filter 230G. Accordingly, in the second light emitting area LA2, the second transmitted light L2G having a green color may be emitted to the outside (i.e., to the first direction D1) passing through the second base substrate 210.

The third color conversion part 256 may overlap the third light emitting area LA3. The third color conversion part 256 may convert the incident light L1 to the third transmitted light L2B having a blue color. For example, the third color conversion part 256 may include a resin part 256a, scattering particle 256b, and wavelength conversion particle 256c. The resin part 256a and the scattering particle 256b of the third color conversion part 256 may be substantially the same as or similar to the resin part 252a and the scattering particle 252b of the first color conversion part 252.

For example, the wavelength conversion particle 256c of the third color conversion part 256 may include a quantum dot that is to absorb the incident light L1 and emit blue light. Accordingly, the third color conversion part 256 may convert the incident light L1 to emit the third transmitted light L2B having a blue color. A remainder of the incident light L1, which is not converted by the third color conversion part 256, may be blocked by the blue color filter 230B. Accordingly, in the third light emitting area LA3, the third transmitted light L2B having a blue color may be emitted to the outside (i.e., to the first direction D1) passing through the second base substrate 210.

As the first to third transmitted lights L2R, L2G, and L2B emitted to the outside passing through the second base substrate 210 may be combined in the first to third light emitting areas LA1, LA2, and LA3, the image may be displayed in the display area DA.

The light blocking member 260 may be located in the peripheral area PA and the sealing area SA under the second base substrate 210. For example, the light blocking member 260 may be located in the peripheral area PA and the sealing area SA under the second base substrate 210 to surround the display area DA in a plan view. The light blocking member 260 may prevent circuit structures such as wirings, a driving circuit, or the like located in the peripheral area PA of the first substrate 100 from being viewed from the outside of the display device 10. In addition, the light blocking member 260 may prevent a light leakage in which a light reflected from the circuit structure or a light emitted from the display area DA passes through the peripheral area PA and the sealing area SA of the second base substrate 210 and is emitted in the front direction.

The light blocking member 260 may include a plurality of light blocking layers. The light blocking layers may overlap each other in the first direction D1 and may extend in a second direction D2 perpendicular to the first direction D1. For example, the light blocking member 260 may include a first light blocking layer 260B, a second light blocking layer 260R, and a third light blocking layer 260G. According to some embodiments, the first light blocking layer 260B may be a blue light blocking layer and the second light blocking layer 260R may be a red light blocking layer and the third light blocking layer 260G may be a green light blocking layer. As illustrated in FIG. 3, the first light blocking layer 260B, the second light blocking layer 260R, and the third light blocking layer 260G may overlap each other in the first direction D1. Accordingly, the light blocking member 260 may effectively block a light progressing in the first direction D1.

According to some embodiments, the second substrate 200 may further include a low refractive index layer 270, a first capping layer 280, and a second capping layer 282.

The low refractive index layer 270 may be located under the second base substrate 210 to surround the color filter layer 230 and the light blocking member 260. According to some embodiments, the low refractive index layer 270 may have a smaller refractive index than the color conversion layer 250. The low refractive index layer 270 may increase luminance and lifespan of the display device 10 by improving light extraction efficiency.

According to some embodiments, the low refractive index layer 270 may include hollow particles. The hollow particles may be dispersed in a resin matrix. The hollow particles may include an inorganic material. For example, the hollow particles may include silica (SiO2), magnesium fluoride (MgF2), iron oxide (Fe3O4), or the like. These can be used alone or in a combination thereof. The resin matrix may include an acrylic resin, a siloxane-based resin, a urethane-based resin, an imide-based resin, or the like, and may be selected in consideration of refractive index and fairness.

The first capping layer 280 may be located on the bottom surface of the low refractive index layer 270. According to some embodiments, the first capping layer 280 may be entirely located in the display area DA, the peripheral area PA, and the sealing area SA. For example, the first capping layer 280 may include silicon oxide (SiOx), silicon nitride (SiNx), silicon oxynitride (SiOxNy), or the like. These can be used alone or in a combination thereof.

The second capping layer 282 may be located on the bottom surface of the first capping layer 280 in the peripheral area PA and the sealing area SA, and on the bottom surface of the color conversion layer 250 in the display area DA. That is, the second capping layer 282 may be entirely located in the display area DA, the peripheral area PA, and the sealing area SA. For example, the second capping layer 282 may be located under the second base substrate 210 to surround the partition wall 240, the first color conversion part 252, the second color conversion part 254, the third color conversion part 256, and the light blocking layer 260. For example, the second capping layer 282 may include silicon oxide (SiOx), silicon nitride (SiNx), silicon oxynitride (SiOxNy), or the like. These can be used alone or in a combination thereof.

Figure 4:
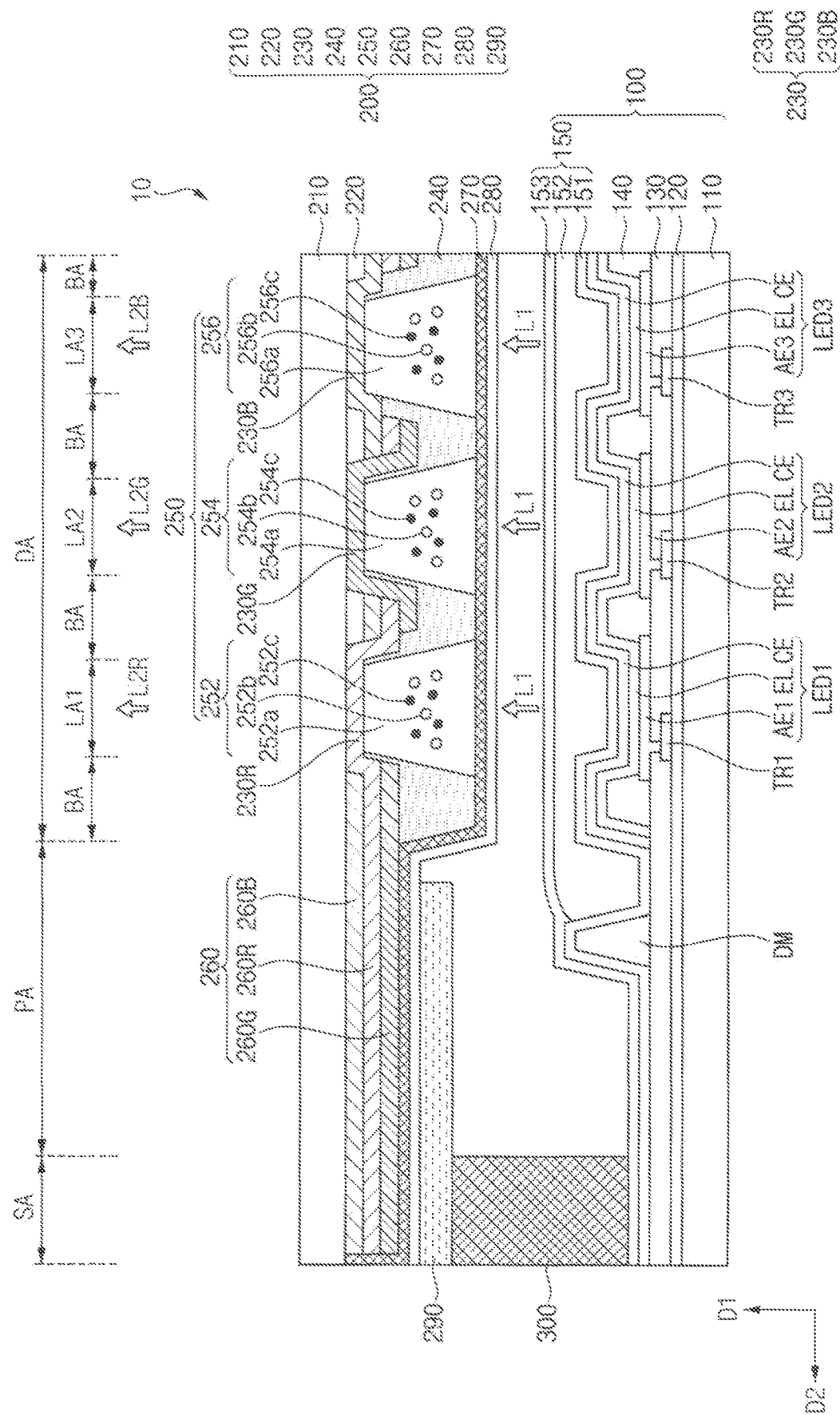
FIG. 4 is an enlarged cross-sectional view of another example of area 'A' of FIG. 2 according to some embodiments.

FIG. 4 is an enlarged cross-sectional view of another example of area 'A' of FIG. 2.

Referring to FIG. 4, the region 'A' according to some embodiments of the present invention may be substantially identical to region 'A' described above with reference to FIG. 3 except for the region in which the low refractive index layer 270 and the first capping layer 280 are located.

Referring to FIG. 4, according to some embodiments, the low refractive index layer 270 may be located under the second base substrate 210 to surround the color conversion layer 250 and the light blocking member 260. That is, the low refractive index layer 270 may be entirely located in the display area DA, the peripheral area PA, and the sealing area SA. For example, the low refractive index layer 270 may be located under the second base substrate 210 to cover the partition wall 240, the first color conversion part 252, the second color conversion part 254, the third color conversion part 256, and the light blocking layer 260. In this case, the first capping layer 280 may be located on the bottom surface of the low refractive index layer 270, and the second capping layer 282 may be omitted.

Referring to FIGS. 1 to 4, the second substrate 200 may include a column spacer 290.

The column spacer 290 may be located on a bottom surface of the light blocking member 260. According to some embodiments, when the low refractive index layer 270 is located on the bottom surface of the light blocking member 260, the column spacer 290 may be located on the bottom surface of the low refractive index layer 270. According to some embodiments, when the low refractive index layer 270 is located on the bottom surface of the light blocking member 260, and at least one capping layer selected from the capping layer 280 and the second capping layer 282 is located on the bottom surface of the low refractive index layer 270 in the peripheral area PA and the sealing area SA, the column spacer 290 may be located on a bottom surface of the capping layer.

The column spacer 290 may minimize deformation by external pressure of the first substrate 100 and the second substrate 200 while bonding the first substrate 100 and the second substrate 200. In addition, the column spacer 290 may maintain a gap between the first substrate 100 and the second substrate 200. Accordingly, the column spacer may prevent or reduce the abnormal phenomenon occurring in an edge area of the display device 10 due to separation of layers or cracks occurring in the second substrate 200.

According to some embodiments, the column spacer 290 may include a polymer resin. According to some embodiments, a pigment or a dye may be dispersed in the polymer resin. For example, at least a portion of the column spacer 290 may include a light blocking material such as a black pigment, a dye, or a carbon black. That is, the column spacer 290 may be black.

According to some embodiments, the column spacer 290 may extend in the second direction D2 to be located in the peripheral area PA and the sealing area SA. That is, the column spacer 290 may overlap the sealing member 300 in the first direction D1 in the sealing area SA. Accordingly, the column spacer 290 simultaneously supports the peripheral area PA and the sealing area SA to further minimize deformation of the first substrate 100 and the second substrate 200. In addition, even if the thickness of the sealing member 300 in the first direction D1 is not excessively increased, the column spacer 290 may support the sealing area SA, so that the deformation of the first substrate 100 and the second substrate 200 can be effectively prevented. Accordingly, the efficiency of the bonding process of the first substrate 100 and the second substrate 200 may be further improved.

According to some embodiments, as shown in FIG. 3, the column spacer 290 may extend in the second direction D2 to expose a side of the column spacer 290 at the outermost edge of the sealing area SA. That is, the column spacer 290 may overlap the sealing member 300 in the first direction D1 while contacting with the entire upper surface of the sealing member 300 in the sealing area SA. Accordingly, it is possible to effectively prevent a step difference between the second substrate 200 and the sealing member 300 in the sealing area SA, and the deformation of the first substrate 100 and the second substrate 200 due to external pressure may be further minimized.

In some embodiments, the second substrate 200 may include the light blocking member 260 and the column spacer 290. The column spacer 290 may be located on the bottom surface of the low refractive index layer 270 or the bottom surface of the capping layer. Accordingly, while the first substrate 100 and the second substrate 200 are bonded through the sealing member 300, the column spacer 290 may serve as a support for external pressure, so that the deformation of the first substrate 100 and the second substrate 200 may be minimized. In addition, the column spacer 290 may maintain the gap between the first substrate 100 and the second substrate 200. Accordingly, the column spacer 290 may prevent or reduce the abnormal phenomenon occurring in the edge area of the display device 10.

FIGS. 5 to 10 are cross-sectional views illustrating a method of manufacturing a color conversion substrate included in the display device of FIG. 3.

Hereinafter, a method of manufacturing the second substrate 200 included in the display device 10 of FIG. 3 will be briefly described with reference to FIGS. 5 to 10.

Figure 5:
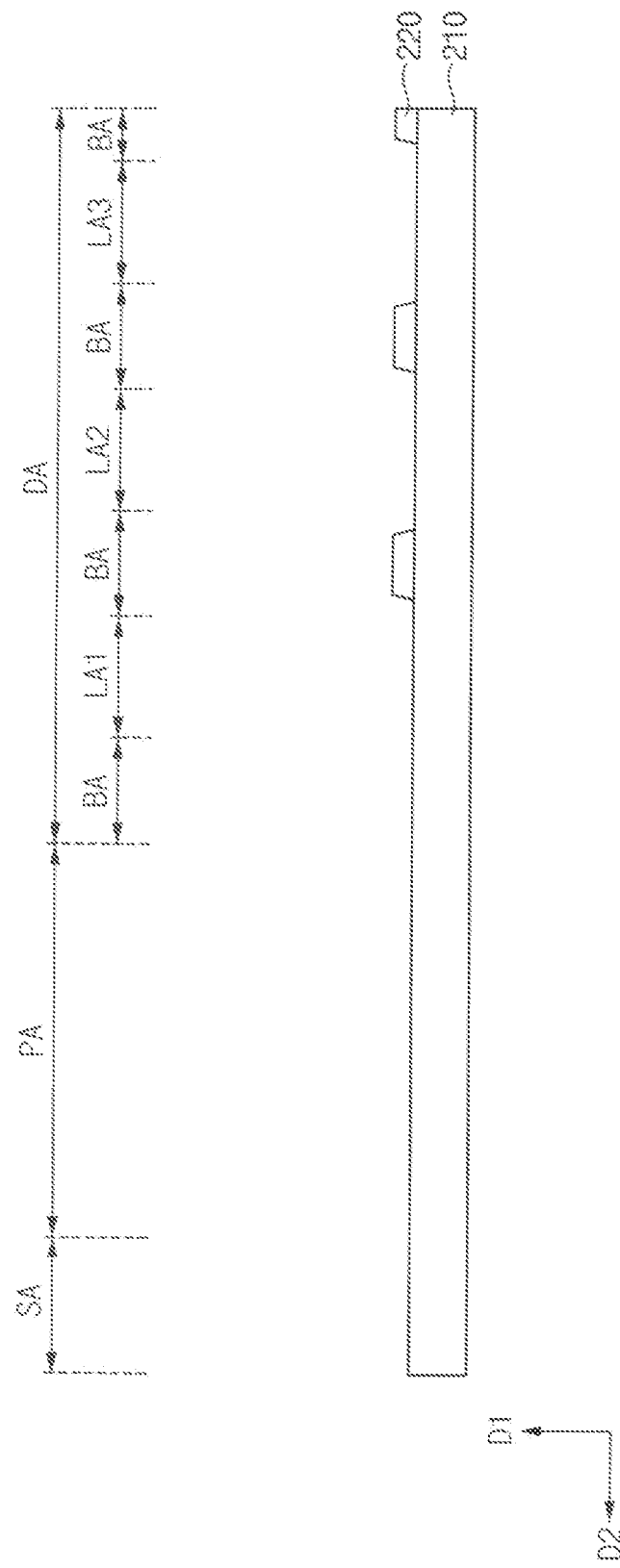
FIGS. 5 to 10 are cross-sectional views illustrating a method of manufacturing a color conversion substrate included in the display device of FIG. 3 according to some embodiments.

First, referring to FIG. 5, the organic layer 220 may be formed in the display area DA on the second base substrate 210.

Figure 6:
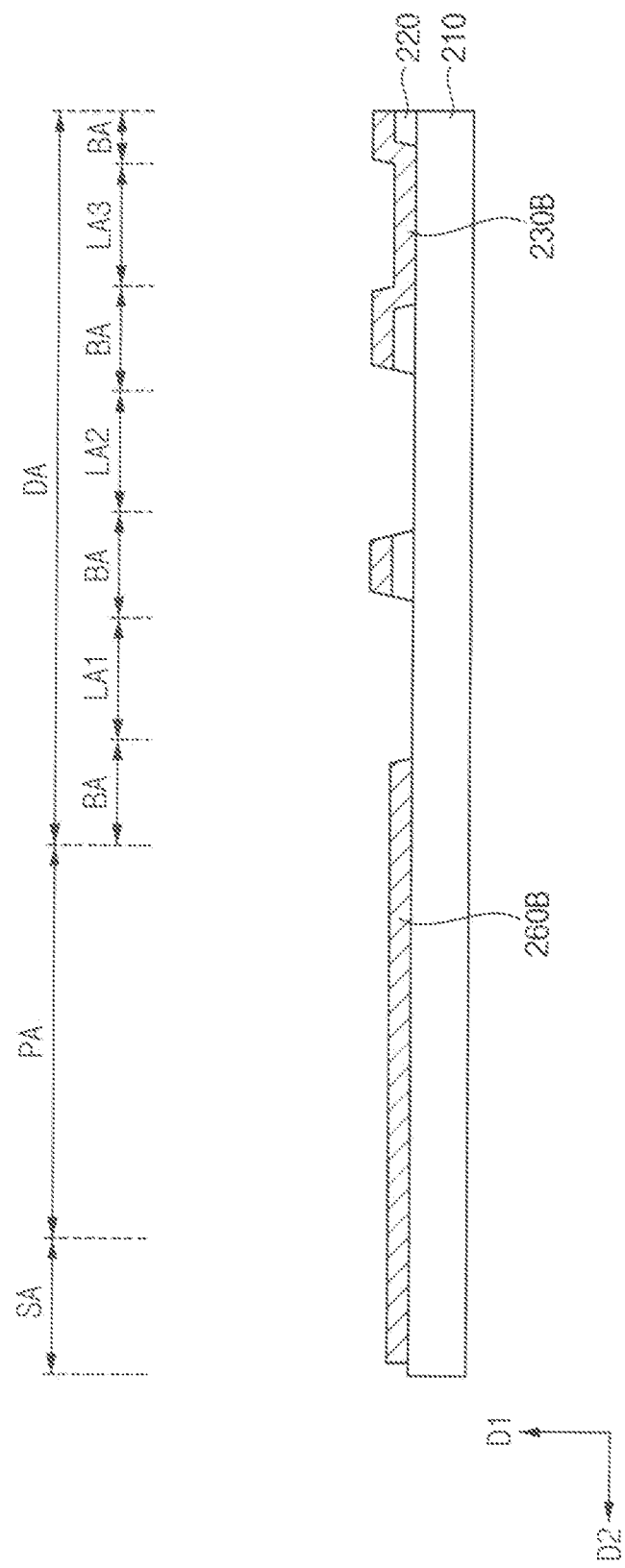

Referring to FIG. 6, the blue color filter 230B may be formed in the display area DA on the second base substrate 210. The first light blocking layer 260B may be formed in the peripheral area PA and the sealing area SA on the second base substrate 210. The blue color filter 230B may be formed to overlap the third light emitting area LA3 and the light blocking area BA. The first light blocking layer 260B may be formed to surround the display area DA. According to some embodiments, the blue color filter 230B and the first light blocking layer 260B may be substantially simultaneously formed with each other.

Figure 7:
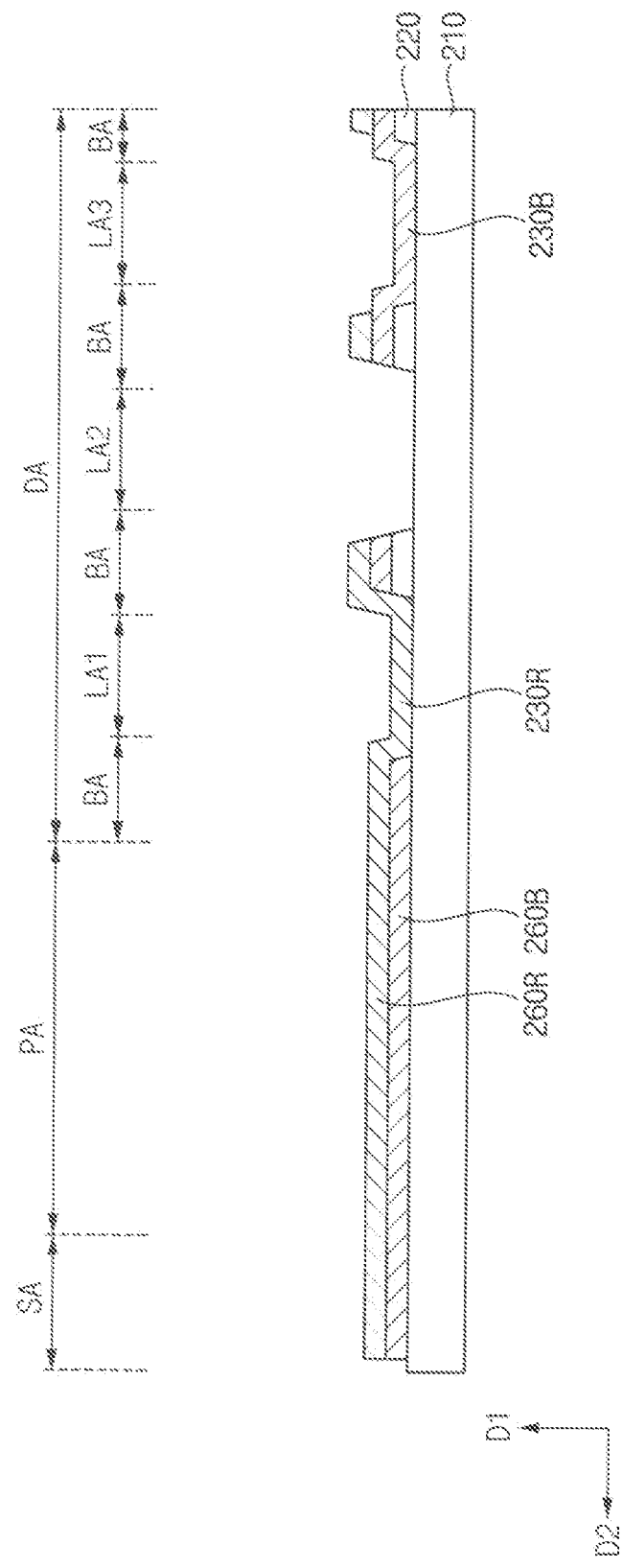

Referring to FIG. 7, the red color filter 230R may be formed in the display area DA on the second base substrate 210. The second light blocking layer 260R may be formed in the peripheral area PA and the sealing area SA on the second base substrate 210. The red color filter 230R may be formed to overlap the first light emitting area LA1 and the light blocking area BA. The second light blocking layer 260R may be formed on the first blocking layer 260B. According to some embodiments, the red color filter 230R and the second light blocking layer 260R may be substantially simultaneously formed with each other.

Figure 8:
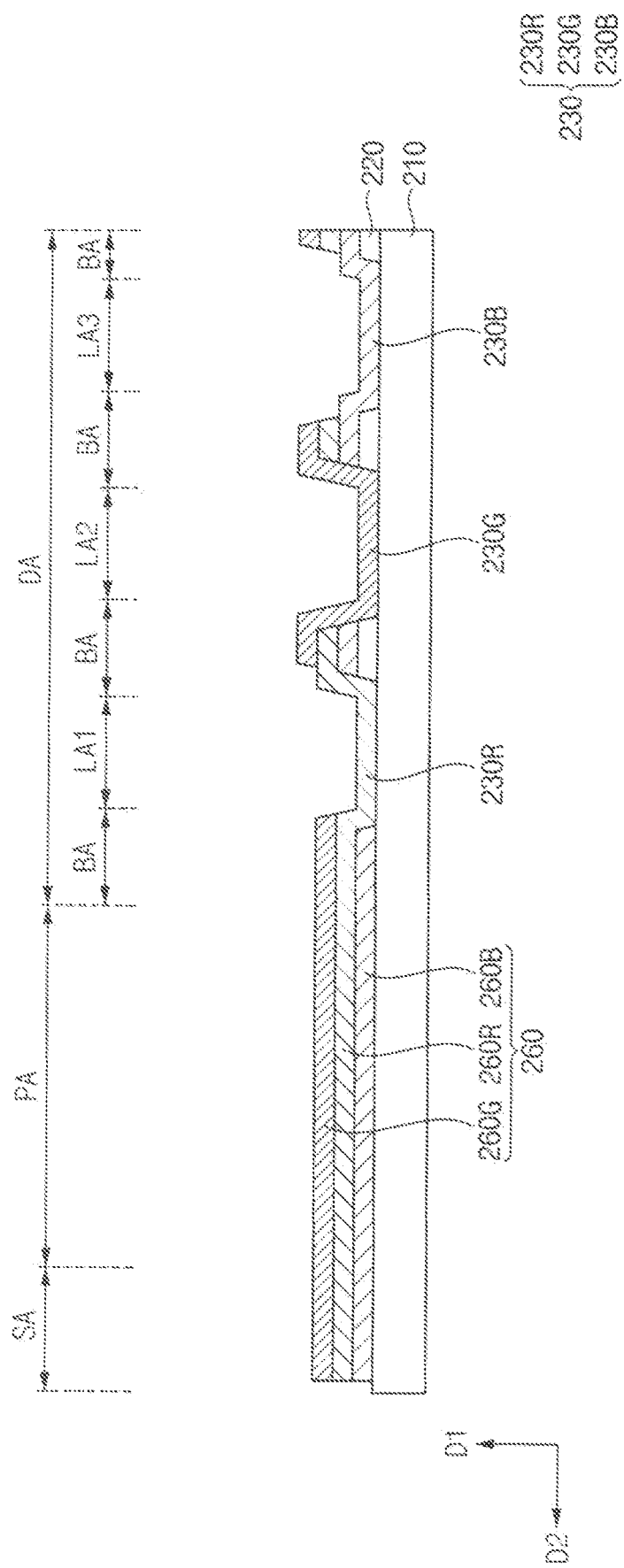

Referring to FIG. 8, the green color filter 230G may be formed in the display area DA on the second base substrate 210. The third light blocking layer 260G may be formed in the peripheral area PA and the sealing area SA on the second base substrate 210. The green color filter 230G may be formed to overlap the second light emitting area LA2 and the light blocking area BA. The third light blocking layer 260G may be formed on the second blocking layer 260R. According to some embodiments, the green color filter 230G and the third light blocking layer 260G may be substantially simultaneously formed with each other.

Figure 9:
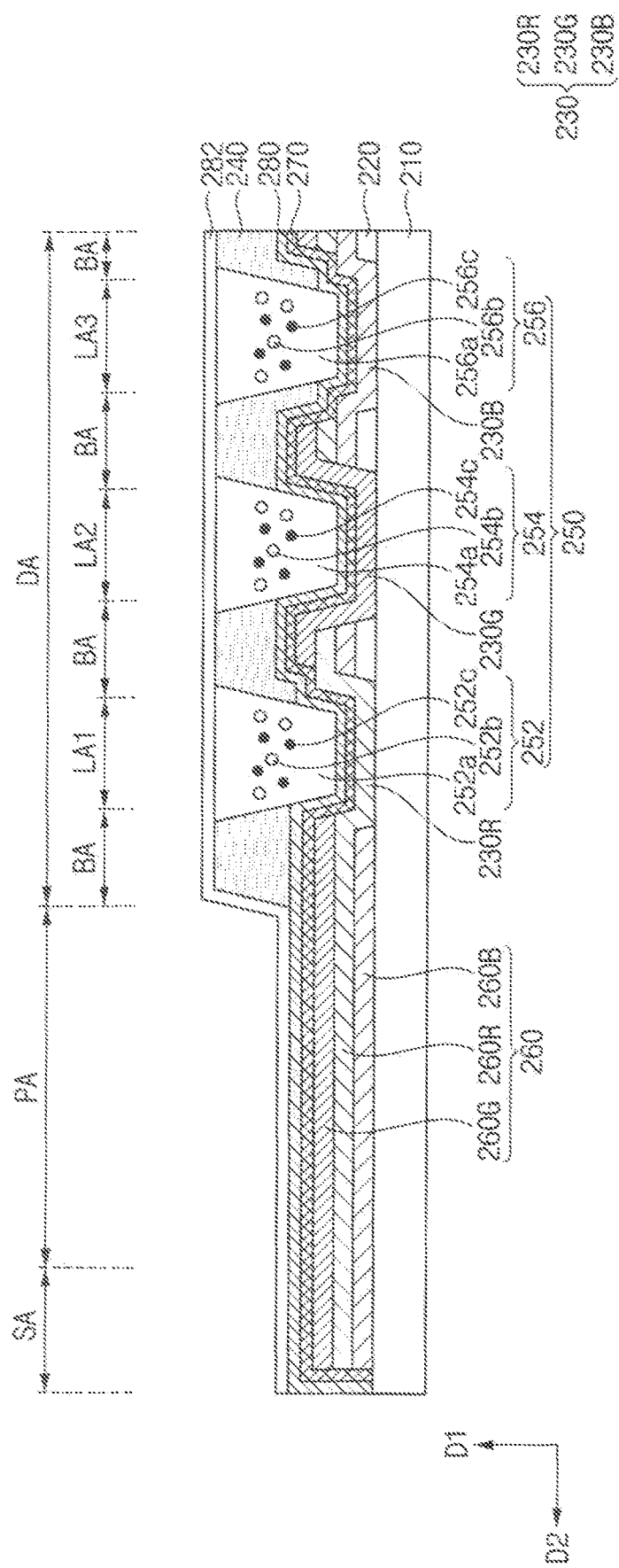

Referring to FIG. 9, the low refractive index layer 270 surrounding the color filter layer 230 and the light blocking layer 260 may be formed on the color filter layer 230 and the light blocking layer 260. Subsequently, the first capping layer 280 covering the low refractive index layer 270 may be formed on the low refractive index layer 270. Subsequently, the partition wall 240 may be formed in the display area DA on the first capping layer 280. Subsequently, the openings respectively exposing the first to third light emitting areas LA1, LA2, and LA3 may be formed in the partition wall 240. The first color conversion part 252, the second color conversion part 254, and third color conversion 256 may be formed in the openings of the partition wall 240, respectively. Subsequently, the second capping layer 282 covering the partition wall 240, the first color conversion part 252, the second color conversion part 254, the third color conversion part 256, the light blocking member 260 may be formed.

Figure 10:
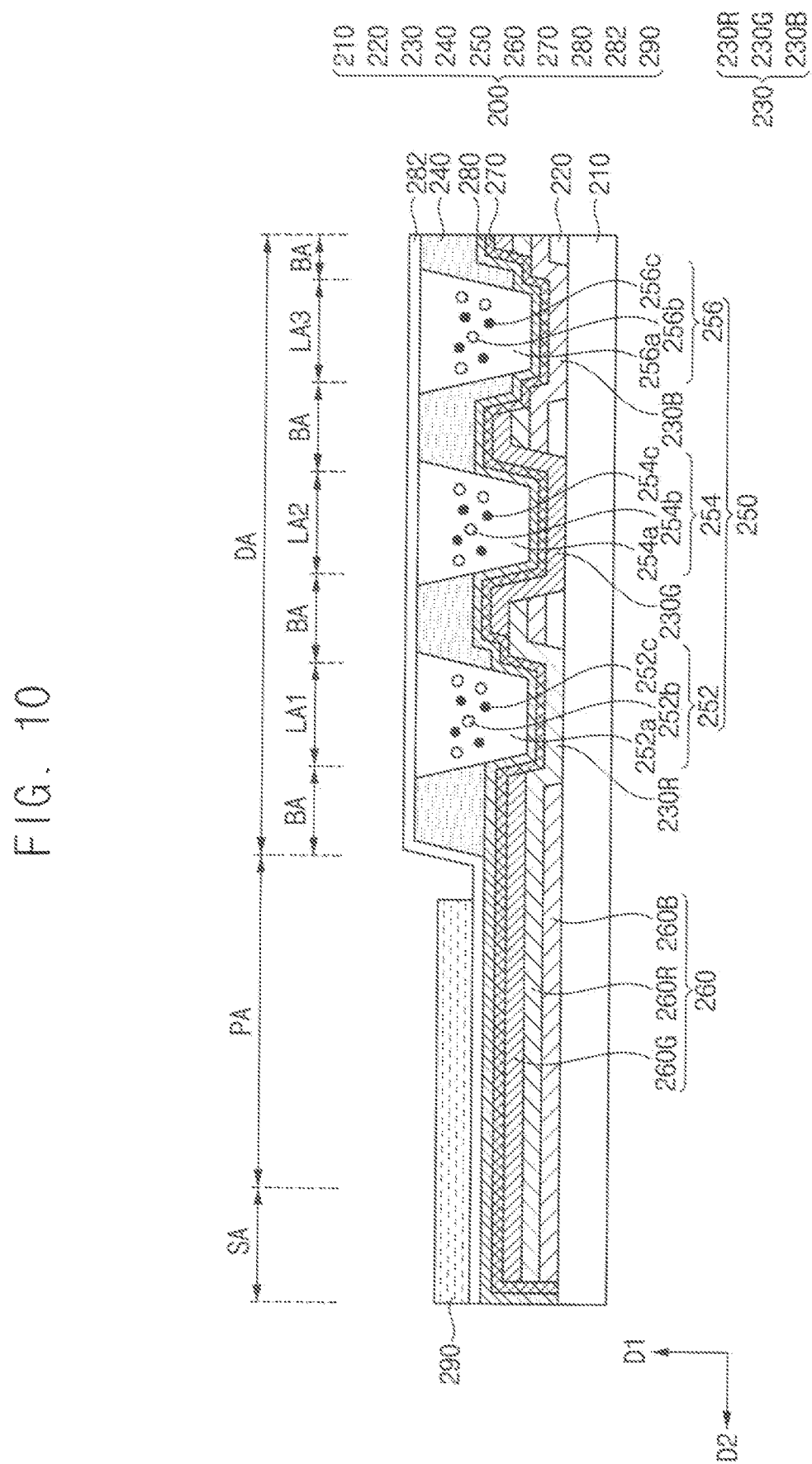

Referring to FIG. 10, the column spacer 290 may be formed in the peripheral PA and the sealing area SA on the second capping layer 282. The column spacer 290 may maintain the gap between the first substrate 100 and the second substrate 200.

Figure 11:
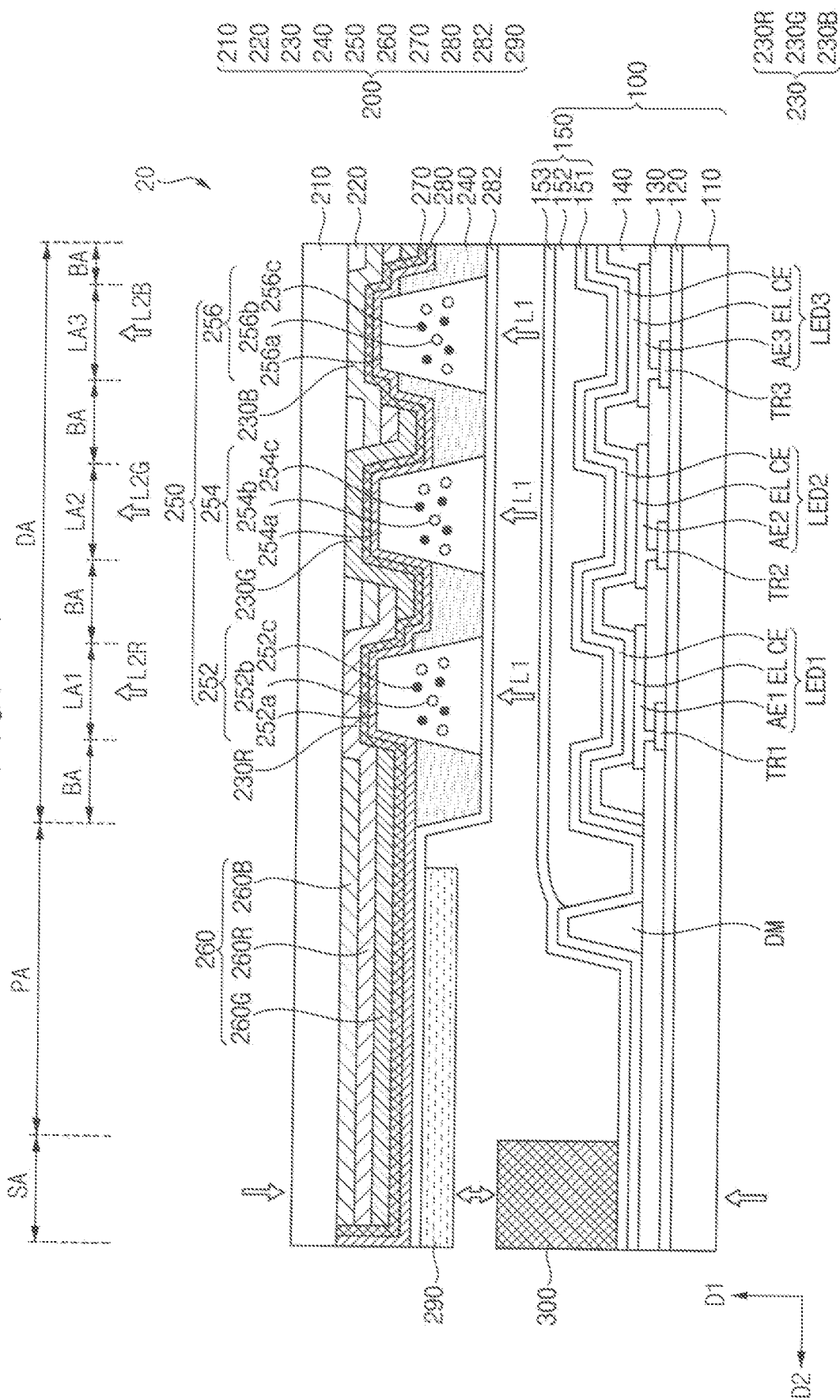
FIGS. 11 to 12 are cross-sectional views illustrating display device according to some embodiments.
Figure 12:
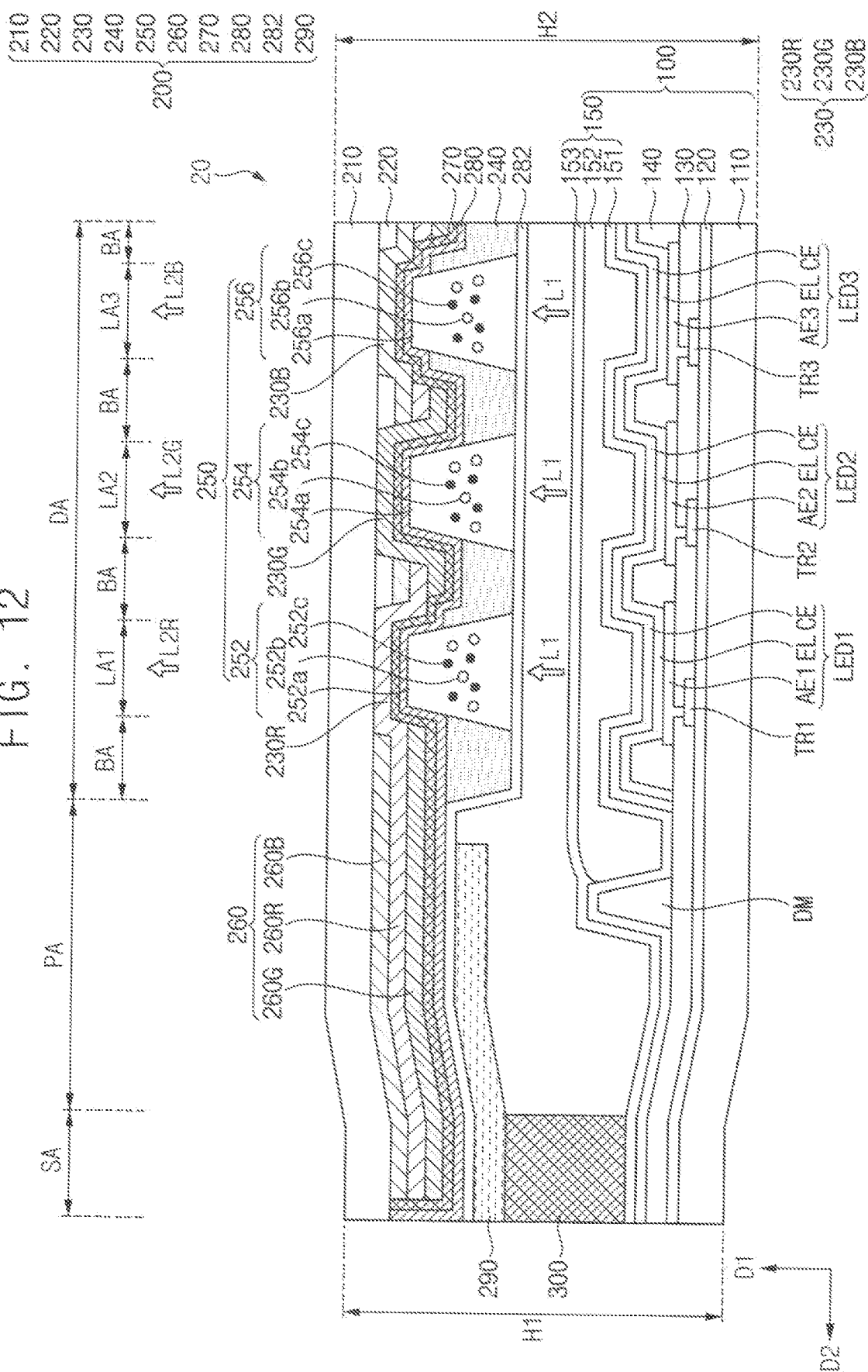

FIGS. 11 to 12 are cross-sectional views illustrating display device according to some embodiments.

Referring FIGS. 11 to 12, the display device 20 according to some embodiments may be substantially the same as the display device 10 described above with reference to FIG. 3, except for the thickness of the sealing member 300.

According to some embodiments, shown in FIGS. 11 to 12, a first gap H1 between the first substrate 100 and the second substrate 200 in the sealing area SA may be smaller than a second gap H2 between the first substrate 100 and the second substrate in the display area DA. When the thickness of the sealing member 300 in the first direction D1 is relatively reduced, while the first substrate 100 and the second substrate 200 are bonded through the sealing member 300, the first substrate 100 and the second substrate 200 may be slightly deformed by the external pressure. In this case, a difference between the first gap H1 and the second gap H2 may not increase because the column spacer 290 is located in the sealing area SA. Accordingly, the abnormal phenomenon occurring in the edge area of the display device 20 may be prevented and, at the same time, a margin for the thickness of the sealing member 300 may be secured. Accordingly, the efficiency of the bonding process of the first substrate 100 and the second substrate 200 may be further improved.

Figure 13:
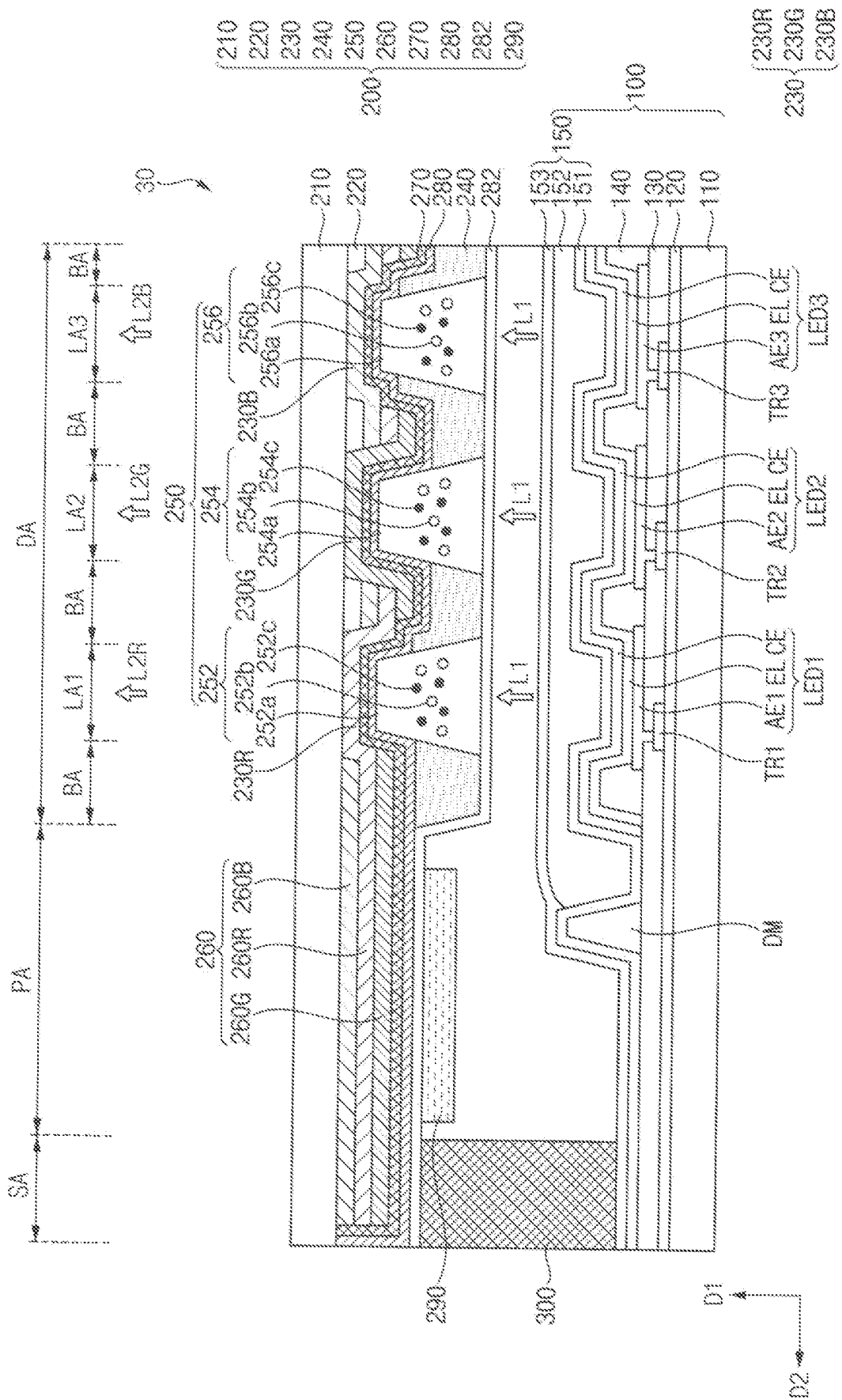
FIG. 13 is a cross-sectional view illustrating display device according to some embodiments.

FIG. 13 is a cross-sectional view illustrating display device according to some embodiments.

Referring FIG. 13, the display device 30 according to some embodiments may be substantially the same as the display device 10 described above with reference to FIG. 3, except for the area of where the column spacer 290 is located.

According to some embodiments, the column spacer 290 may not be located in the sealing area SA but may extend in the second direction D2 to be located in the peripheral area PA. That is, the column spacer 290 may be located only in the peripheral area PA and may not overlap the sealing member 300.

In this case, the sealing member 300 may directly contact the light blocking member 260 in the sealing area SA. According to some embodiments, when the light blocking member 260 is surrounded by the low refractive index layer 270, the sealing member 300 may directly contact the low refractive index layer 270. According to some embodiments, when the light blocking member 260 is surrounded by the low refractive index layer 270 and the capping layer is located on the bottom surface of the low refractive index layer 270, the sealing member 300 may directly contact the capping layer.

That is, the sealing member 300 may be arranged to surround the peripheral area PA. Accordingly, because the column spacer 290 is not located in the sealing area SA and only the sealing member 300 is exposed to the external environment, the moisture permeability reliability of the display device 30 may be further improved. Also, in this case, it may be required to maintain a relatively high thickness of the sealing member 300 in the first direction D1 for compensating a step difference between the first substrate 100 and the second substrate 200.

Figure 14:
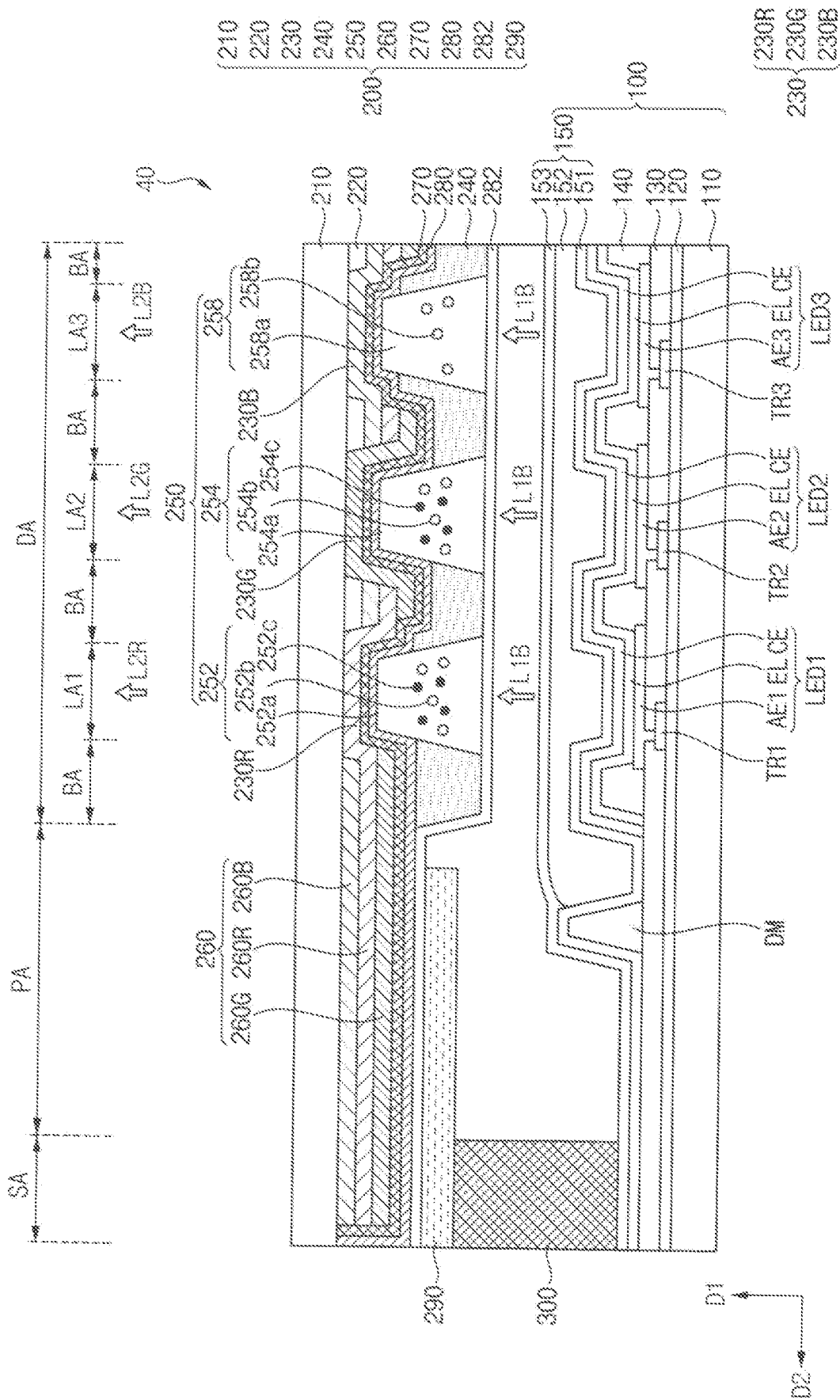
FIG. 14 is a cross-sectional view illustrating display device according to some embodiments.

FIG. 14 is a cross-sectional view illustrating display device according to some embodiments.

Referring FIG. 14, the display device 40 according to some embodiments may be substantially the same as the display device 10 described above with reference to FIG. 3, except for a light transmitting part 258.

According to some embodiments, in the display device 40, all the lights generated from the plurality of pixels of the first substrate 100 and incident to the second substrate 200 may be an incident light L1B (hereinafter, blue light (L1B)). In this case, the color conversion layer 250 may include the first color conversion part 252, the second color conversion part 254, and the light transmitting part 258.

The first color conversion part 252 may be substantially the same as the first color conversion part 252 described with reference to FIG. 3, and the second color conversion part 254 may be substantially the same as the second color conversion part 254 described with reference to FIG. 3.

The transmitting part 258 may overlap the third light emitting area LA3. For example, the light transmitting part 258 may include a resin part 258a and scattering particle 258b. The resin part 258a and the scattering particle 258b of the light transmitting part 258 may be substantially the same as or similar to the resin part 252a and the scattering particle 252b of the first color conversion part 252.

The light transmitting part 258 may not convert the blue light L1B. That is, the light transmitting part 258 may emit the third transmitted light L2B having substantially the same wavelength as that of the blue light L1B. Accordingly, in the third light emitting area LA3, the third transmitted light L2B having a blue color may be emitted to the outside (i.e., to the first direction D1) passing through the second base substrate 210.

The display device according to some embodiments may include the second substrate 200 including the light blocking member 260 and the column spacer 290 located on the bottom surface of the low refractive index layer 270, or the capping layer. While the first substrate 100 and the second substrate 200 are bonded through the sealing member 300, the column spacer 290 may minimize the deformation of the first substrate 100 and the second substrate 200. In addition, the column spacer 290 may maintain the gap between the first substrate 100 and the second substrate 200. Accordingly, the column spacer 290 may prevent or reduce the abnormal phenomenon occurring in the edge area of the display device. In addition, the column spacer 290 may be located in consideration of the thickness of the sealing member 300, the step difference between the column spacer 290 and the sealing member 300, or the like. Accordingly, the efficiency of the bonding process of the first substrate 100 and the second substrate 200 may be improved.

It should be understood that example embodiments described herein should be considered in a descriptive sense only and not for purposes of limitation. Descriptions of features or aspects within the example embodiments should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims and their equivalents.

What is claimed is:

1. A color conversion substrate comprising:
a base substrate including a display area, a peripheral area positioned around the display area, and a sealing area positioned around the peripheral area;
a color filter layer in the display area under the base substrate;
a color conversion layer including a plurality of color conversion parts spaced apart from each other on a bottom surface of the color filter layer;
a light blocking member in the peripheral area and the sealing area under the base substrate and including light blocking layers, wherein the light blocking layers overlap each other in a first direction that is a thickness direction of the base substrate and extend in a second direction perpendicular to the first direction; and
a column spacer on a bottom surface of the light blocking member and extending in the second direction to be in the peripheral area and the sealing area.

2. The color conversion substrate of claim 1, wherein a portion of the column spacer overlaps a sealing member in the sealing area.

3. The color conversion substrate of claim 1, wherein a side surface of the column spacer is exposed at an outermost edge of the sealing area.

4. The color conversion substrate of claim 1, wherein the column spacer comprises a polymer resin, and
wherein a pigment or a dye is dispersed in the polymer resin.

5. The color conversion substrate of claim 1, further comprising:
a low refractive index layer surrounding the color filter layer and the light blocking member, and
wherein the column spacer is on a bottom surface of the low refractive index layer.

6. The color conversion substrate of claim 5, further comprising:
a first capping layer on the bottom surface of the low refractive index layer; and
a second capping layer on a bottom surface of the first capping layer in the peripheral area and the sealing area and on a bottom surface of the color conversion layer in the display area, and
wherein the column spacer is on a bottom surface of the second capping layer.

7. The color conversion substrate of claim 1, further comprising:
a low refractive index layer surrounding the color conversion layer and the light blocking member, and
wherein the column spacer is on a bottom surface of the low refractive index layer.

8. The color conversion substrate of claim 7, further comprising:
a first capping layer on the bottom surface of the low refractive index layer, and
wherein the column spacer is on a bottom surface of the first capping layer.

9. The color conversion substrate of claim 1, wherein the light blocking member includes a first light blocking layer, a second light blocking layer, and a third light blocking layer overlapping each other in the first direction.

10. The color conversion substrate of claim 1, wherein the color filter layer includes a red color filter, a green color filter, and a blue color filter, and
wherein the color conversion layer includes:
a first color conversion part corresponding to the red color filter;
a second color conversion part corresponding to the green color filter; and
a third color conversion part corresponding to the blue color filter.

11. The color conversion substrate of claim 10, wherein the first color conversion part includes a first wavelength conversion particle that convert an incident light into a light having a red color,
- wherein the second color conversion part includes a second wavelength conversion particle that convert an incident light into a light having a green color, and
- wherein the third color conversion part includes a third wavelength conversion particle that convert an incident a light into a blue color.

12. The color conversion substrate of claim 10, wherein the first color conversion part, the second color conversion part, and the third color conversion part further include a scattering particle configured to scatter an incident light.

13. The color conversion substrate of claim 1, wherein the color filter layer includes a red color filter, a green color filter, and a blue color filter, and
- wherein the color conversion layer includes:
  - a first color conversion part corresponding to the red color filter;
  - a second color conversion part corresponding to the green color filter; and
  - a light transmitting part corresponding to the blue color filter.

14. The color conversion substrate of claim 13, wherein the light transmitting part includes a scattering particle configured to scatter an incident light.

15. A color conversion substrate comprising:
- a base substrate including a display area, a peripheral area positioned around the display area, and a sealing area positioned around the peripheral area;
- a color filter layer in the display area under the base substrate;
- a color conversion layer including a plurality of color conversion parts spaced apart from each other on a bottom surface of the color filter layer;
- a light blocking member in the peripheral area and the sealing area under the base substrate and including light blocking layers, wherein the light blocking layers overlap each other in a first direction that is a thickness direction of the base substrate and extend in a second direction perpendicular to the first direction; and
- a column spacer on a bottom surface of the light blocking member and extending in the second direction so as not to be in the sealing area but to be in the peripheral area.

16. A display device comprising:
- a display substrate including a first base substrate and pixels on the first base substrate;
- a color conversion substrate facing the display substrate; and
- a sealing member bonding the display substrate and the color conversion substrate,
- wherein the color conversion substrate includes:
- a second base substrate including a display area, a peripheral area positioned around the display area, and a sealing area positioned around the peripheral area;
- a color filter layer in the display area under the second base substrate;
- a color conversion layer including a plurality of color conversion parts spaced apart from each other on a bottom surface of the color filter layer;
- a light blocking member in the peripheral area and the sealing area under the second base substrate and including light blocking layers, wherein the light blocking layers overlap each other in a first direction that is a thickness direction of the second base substrate and extend in a second direction perpendicular to the first direction; and
- a column spacer on a bottom surface of the light blocking member and extending in the second direction to be in the peripheral area and the sealing area.

17. The display device of claim 16, wherein the display substrate further includes an encapsulation layer covering the pixels and including at least one inorganic encapsulation layer and at least one organic encapsulation layer.

18. The display device of claim 16, further comprising:
- a filling layer between the display substrate and the color conversion substrate.

19. The display device of claim 16, wherein a first distance between the first base substrate and the second base substrate in the sealing area is greater than a second distance between the first base substrate and the second base substrate in the display area.

20. The display device of claim 16, wherein all of the pixels are configured to generate blue light.

21. The display device of claim 16, wherein a portion of the column spacer overlaps a sealing member in the sealing area.

22. The display device of claim 16, wherein a side of the column spacer is exposed at an outermost edge of the sealing area.

* * * * *